（12）United States Patent
Seo et al.

(10) Patent No.: US 7,736,918 B2
(45) Date of Patent: Jun. 15, 2010

(54) PHOTORESIST COATING APPARATUS HAVING NOZZLE MONITORING UNIT AND METHOD FOR SUPPLYING PHOTORESIST USING THE SAME

(75) Inventors: Young-Joon Seo, Hwaseong (KR); Young-Jong Kwon, Hwaseong (KR)

(73) Assignee: Nanofa Co., Ltd., Hwaseong (KR)

( * ) Notice: Subject to any disclaimer, the term of this patent is extended or adjusted under 35 U.S.C. 154(b) by 0 days.

(21) Appl. No.: 12/294,551

(22) PCT Filed: Mar. 30, 2007

(86) PCT No.: PCT/KR2007/001571

§ 371 (c)(1),
(2), (4) Date: Sep. 25, 2008

(87) PCT Pub. No.: WO2007/114603

PCT Pub. Date: Oct. 11, 2007

(65) Prior Publication Data

US 2009/0104720 A1    Apr. 23, 2009

(30) Foreign Application Priority Data

Mar. 30, 2006    (KR) .................... 10-2006-0028928

(51) Int. Cl.
*G01R 31/26* (2006.01)
(52) U.S. Cl. ........................ 438/16; 118/679
(58) Field of Classification Search ............ 438/14, 438/16; 118/679, 684, 668
See application file for complete search history.

(56) References Cited

U.S. PATENT DOCUMENTS 6,391,111 B1    5/2002    Fujimoto et al.
2003/0047136 A1    3/2003    Yang

FOREIGN PATENT DOCUMENTS

KR    1020000013343 A    3/2000

OTHER PUBLICATIONS

International Search Report and Written Opinion for PCT/KR2007/001571 dated Jul. 16, 2007.

*Primary Examiner*—Walter L Lindsay, Jr.
*Assistant Examiner*—Reema Patel
(74) *Attorney, Agent, or Firm*—Greenlee, Winner and Sullivan, P.C.

(57) ABSTRACT

Provided are a photoresist coating apparatus and a method of coating photoresist using the same. The apparatus includes a photoresist supply line through which photoresist is supplied. A fluid control valve is connected to the photoresist supply line to control the flow of the photoresist. A nozzle assembly is connected to the photoresist supply line at a rear end of the fluid control valve. The nozzle assembly includes a nozzle located above the center of a semiconductor wafer loaded in a photoresist coating unit to spray the photoresist. A camera is located outside the photoresist coating unit to monitor the shape or spraying amount of the nozzle located at the tip of the nozzle assembly. A controller converts data monitored by the camera into an electric signal and processes the electric signal.

5 Claims, 11 Drawing Sheets

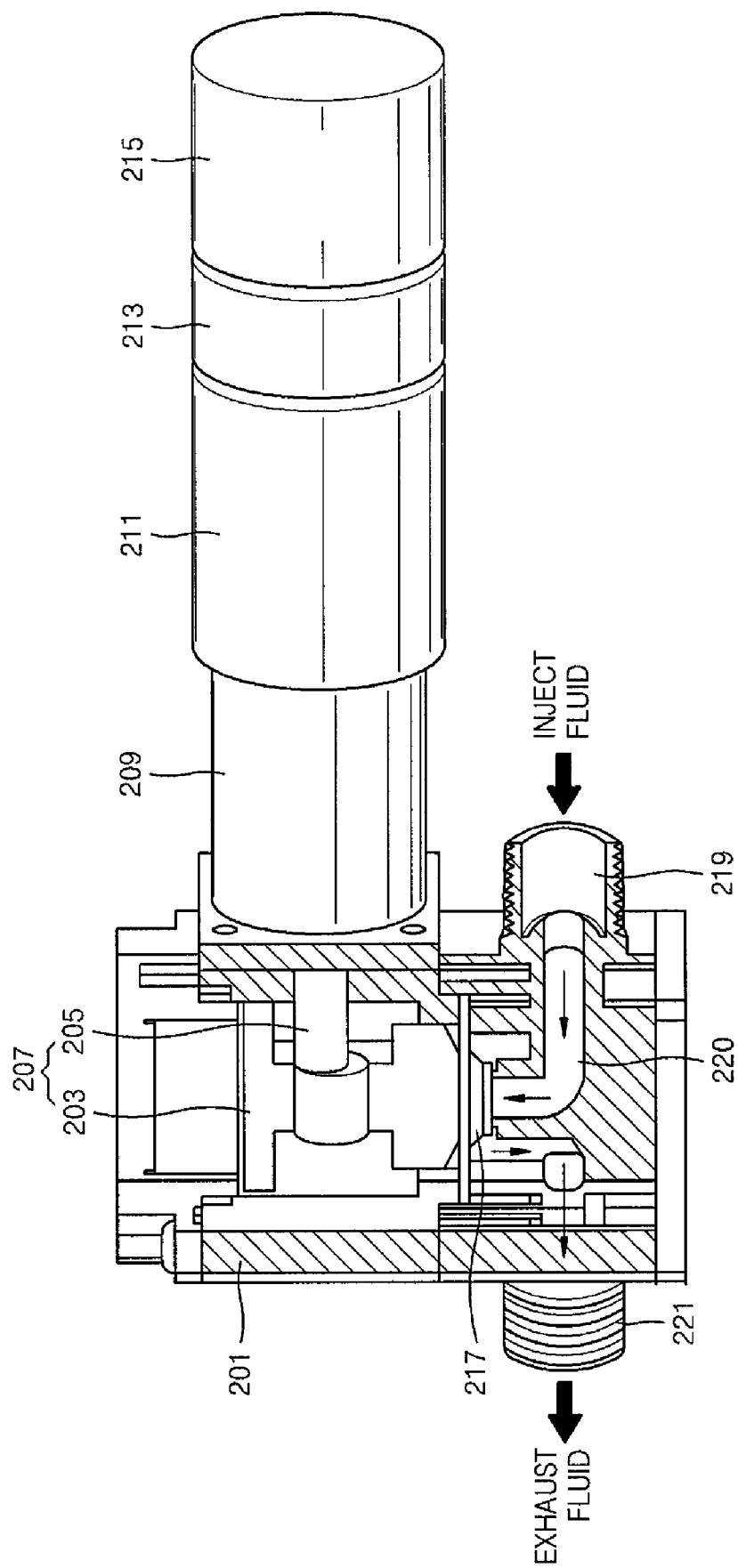

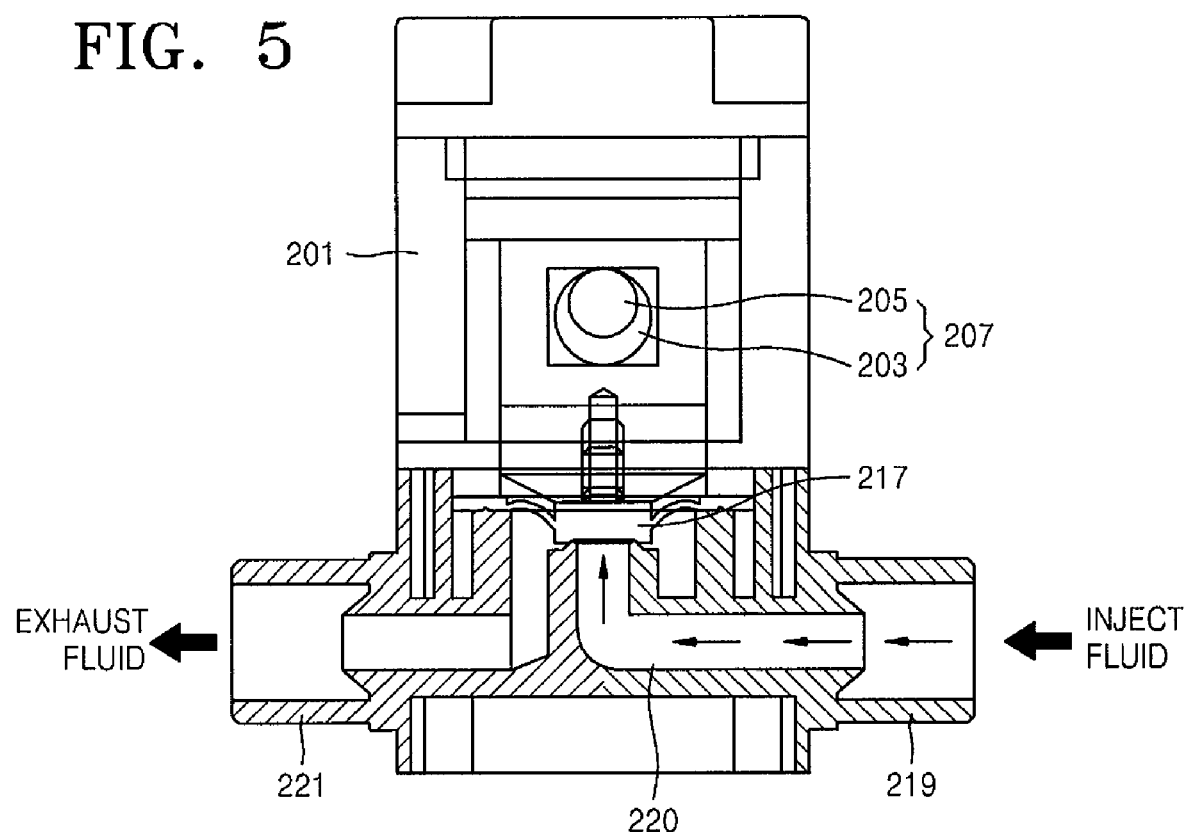
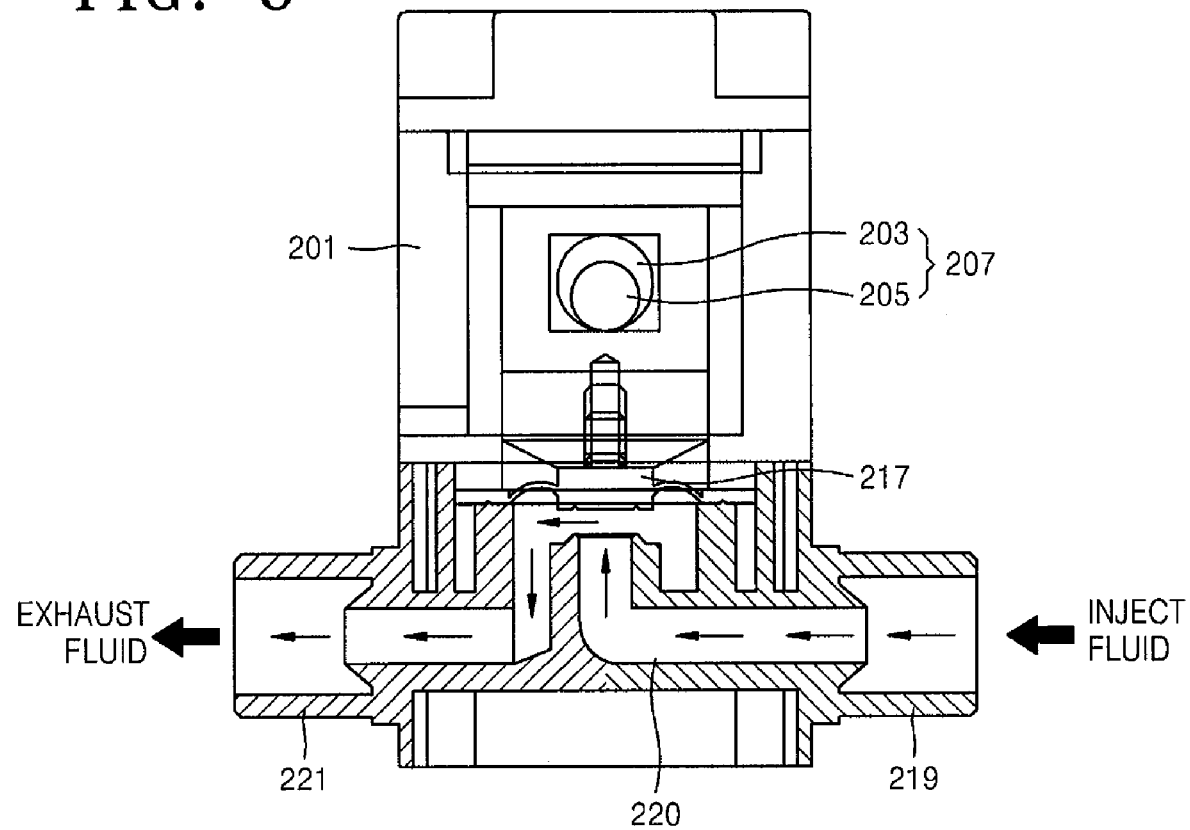

PHOTORESIST COATING APPARATUS HAVING NOZZLE MONITORING UNIT AND METHOD FOR SUPPLYING PHOTORESIST USING THE SAME

CROSS-REFERENCE TO RELATED APPLICATIONS

This application is a United States national stage application under 35 U.S.C. §371 of International Application No. PCT/KR2007/001571, filed Mar. 30, 2007, which claims benefit of Korean Patent Application No. 10-2006-0028928 filed Mar. 30, 2006; both of which are hereby incorporated by reference in their entireties to the extent not inconsistent with the disclosure herein.

TECHNICAL FIELD

The present invention relates to an apparatus used for fabricating an integrated circuit (IC) semiconductor device, and more particularly, to a photoresist coating apparatus used for coating photoresist (PR) on a semiconductor wafer, and a method of coating photoresist using the same.

BACKGROUND ART

Generally, the fabrication of an IC semiconductor device includes performing a lithography process to form a pattern on a specific layer of a semiconductor wafer. The lithography process includes coating photoresist on the semiconductor wafer and exposing and developing the photoresist. Therefore, a photoresist coating apparatus is needed to coat the photoresist on the semiconductor wafer.

With an increase in the integration density of IC semiconductor devices, the spraying amount of photoresist to be coated on a semiconductor wafer must be precisely controlled. However, a conventional photoresist coating apparatus cannot continuously spray a precise amount of photoresist on the semiconductor wafer because of, for example, a variation in the pressure of a pump used for coating the photoresist, a variation in an atmospheric pressure applied to open and close off valves, and the contamination of a nozzle unit.

When a precise amount of photoresist cannot be sprayed on the semiconductor wafer, a nonuniform photoresist layer is uniformly coated on the semiconductor wafer. In this case, exposure and developing processes are performed on the nonuniform photoresist layer, so that a photoresist pattern is not uniformly formed on the semiconductor wafer. The extreme case is that a photoresist coating process and an exposure process need to be performed again or the used semiconductor wafer must be discarded.

BRIEF DESCRIPTION OF THE DRAWINGS

FIG. 4 is a magnified view of a fluid control valve shown in FIG. 2.

FIGS. 5 and 6 illustrate operation of the fluid control valve shown in FIG. 4.

DETAILED DESCRIPTION OF THE INVENTION

Technical Problem

Figure 1:
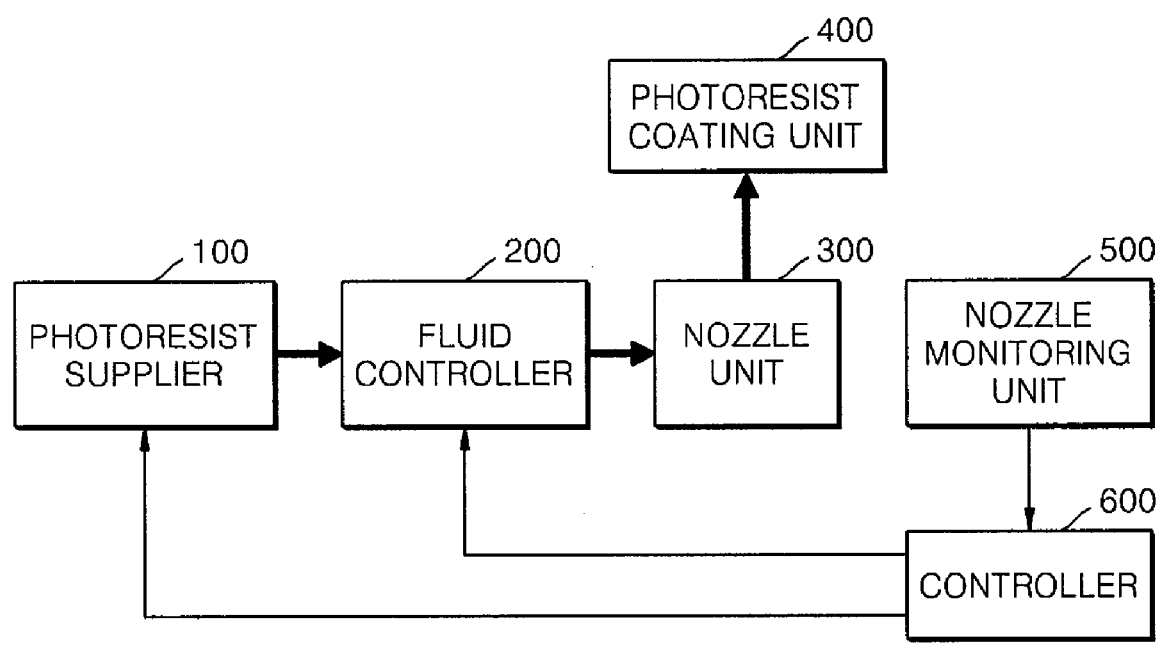
FIG. 1 is a block diagram illustrating the concept of a photoresist coating apparatus having a nozzle monitoring unit according to an embodiment of the present invention.

The present invention provides a photoresist coating apparatus that can monitor and precisely control the amount of photoresist to be sprayed on a semiconductor wafer.

Also, the present invention provides a method of coating photoresist using the photoresist coating apparatus.

Technical Solution

According to an aspect of the present invention, there is provided a photoresist coating apparatus including a photoresist supplier for supplying photoresist, a fluid controller connected to the photoresist supplier to control the flow of the photoresist, and a nozzle unit connected to the fluid controller and including a nozzle for spraying the photoresist on a semiconductor wafer loaded in a photoresist coating unit.

Furthermore, the photoresist coating apparatus according to the present invention includes a nozzle monitoring unit for monitoring the shape or spraying amount of the nozzle of the nozzle unit and a controller for converting data monitored by the nozzle monitoring unit into an electric signal and processing the electric signal.

The nozzle monitoring unit may be a camera. The nozzle monitoring unit may monitor whether or not the nozzle deviates from a decided position, whether or not the nozzle is contaminated, whether or not air bubbles are generated, the flow length or sucked height of the photoresist, a time taken to spray the photoresist, or a time taken to delay the spraying of the photoresist.

According to another aspect of the present invention, there is provided a photoresist coating apparatus including a photoresist supply line through which photoresist is supplied; a fluid control valve connected to the photoresist supply line to control the flow of the photoresist; and a nozzle assembly connected to the photoresist supply line at a rear end of the fluid control valve, the nozzle assembly including a nozzle located above the center of a semiconductor wafer loaded in a photoresist coating unit to spray the photoresist.

Furthermore, the photoresist coating apparatus includes a camera located outside the photoresist coating unit to monitor the shape or spraying amount of the nozzle located at the tip of the nozzle assembly; and a controller for converting data monitored by the camera into an electric signal and processing the electric signal. The electric signal processed by the controller is fed back into the fluid control valve to control the flow of the photoresist sprayed via the nozzle of the nozzle assembly.

The camera may include: a light source for emitting incident light to the nozzle of the nozzle assembly; a lens for receiving reflection light reflected by the nozzle of the nozzle assembly; and a camera controller for monitoring the nozzle of the nozzle assembly using the received reflection light to output an electric signal to the controller. The camera may monitor whether or not the nozzle deviates from a decided position, whether or not the nozzle is contaminated, whether or not air bubbles are generated, the flow length or sucked height of the photoresist, a time taken to spray the photoresist, or a time taken to delay the spraying of the photoresist.

According to yet another aspect of the present invention, there is provided a method of coating photoresist including: loading a semiconductor wafer on a chuck of a photoresist coating unit; and transferring a nozzle assembly such that a nozzle is located over the center of the chuck of the photoresist coating unit. The shape of the nozzle of the nozzle assembly is primarily monitored using a camera. The spraying amount of photoresist is secondarily monitored using the camera while coating the photoresist on the semiconductor wafer via the nozzle of the nozzle assembly. Data primarily and secondarily monitored by the camera is converted into an electric signal, the electric signal is processed, and the electric signal is applied to a fluid control valve to control the flow of the photoresist sprayed on the semiconductor wafer loaded in the photoresist coating unit.

As described above, the photoresist coating apparatus according to the present invention includes the nozzle monitoring unit so that the amount of photoresist sprayed on the semiconductor wafer can be precisely controlled.

Advantageous Effects

As described above, a photoresist coating apparatus according to the present invention includes a camera constituting a nozzle monitoring unit to monitor the shape of a nozzle or the spraying amount of photoresist. The camera can monitor whether or not the nozzle deviates from its decided position, whether or not the nozzle is contaminated, whether or not air bubbles are generated, the flow length or sucked height of photoresist, a time taken to spray the photoresist, or a time taken to delay the spraying of the photoresist. Thus, the photoresist coating apparatus according to the present invention can convert monitoring data into an electric signal and process the electric signal so that the flow of the photoresist sprayed on a semiconductor wafer loaded in a fluid controller can be precisely controlled.

Best Mode For Carrying Out The Invention

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. The same reference numerals are used to denote the same elements throughout the specification.

FIG. 1 is a block diagram illustrating the concept of a photoresist coating apparatus having a nozzle monitoring unit according to an embodiment of the present invention.

Referring to FIG. 1, the photoresist coating apparatus includes a photoresist supplier 100 that includes, for example, a photoresist storage tank, a photoresist supply line, and a photoresist pump. A fluid controller 200, for example, a fluid control valve, is connected to the photoresist supplier 100 and controls the on/off and flow rate of supplied photoresist. A nozzle unit 300, for example, a nozzle assembly having nozzles, is connected to the fluid controller 200 and allows photoresist to be sprayed on a semiconductor wafer loaded in a photoresist coating unit 400.

Also, the photoresist coating apparatus according to the present invention includes a nozzle monitoring unit 500, for example, a camera, to monitor the nozzle unit 300. The nozzle monitoring unit 500 monitors the shape of the nozzle of the nozzle unit 300 or the amount of photoresist to be sprayed through the nozzle. The nozzle monitoring unit 500 monitors whether or not the nozzle deviates from its decided position, whether or not the nozzle is contaminated, whether or not air bubbles are generated, the flow length or sucked height of photoresist, a time taken to spray the photoresist, the spraying amount of the photoresist, or a time taken to delay the spraying of the photoresist.

Furthermore, the photoresist coating apparatus according to the present invention includes a controller 600, for example, a computer, to convert data monitored by the nozzle monitoring unit 500 into an electric signal and process the electric signal. The electric signal processed by the controller 600 is fed back into the photoresist supplier 100 and, especially, the fluid controller 200, so that the fluid controller 200 can control the on/off and the flow rate of photoresist sprayed from the nozzle unit 300.

Figure 2:
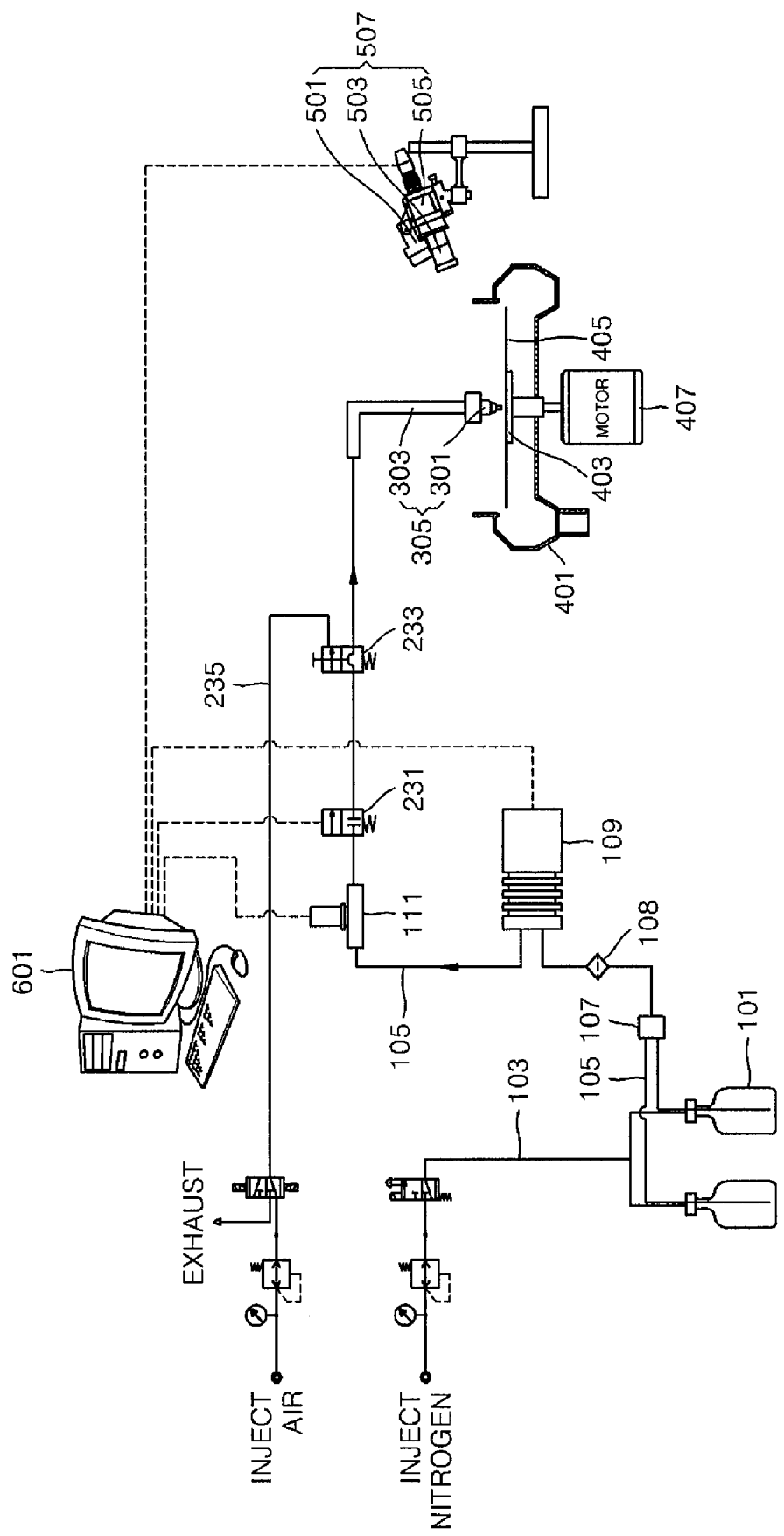
FIG. 2 is a view showing the construction of a photoresist coating apparatus having a nozzle monitoring unit according to an embodiment of the present invention.

FIG. 2 is a view showing the construction of a photoresist coating apparatus having a nozzle monitoring unit according to an embodiment of the present invention.

Referring to FIG. 2, the photoresist coating apparatus includes a photoresist supplier 100. The photoresist supplier 100 (refer to FIG. 1) includes a plurality of photoresist storage tanks 101, a nitrogen injection line 103, a plurality of photoresist supply lines 105, and switch valves 107. The photoresist storage tank 101 stores photoresist to be sprayed. The nitrogen injection line 103 is used to inject nitrogen into the photoresist storage tank 101. The photoresist supply lines 105 are connected to the photoresist storage tank 101. The switch valves 107 are connected to the photoresist supply lines 105 to select one of the photoresist storage tanks 101. In other words, photoresist is supplied from the photoresist storage tank 101 that is arbitrarily selected by the switch valves 107.

The photoresist supplier 100 further includes a filter 108 and a photoresist pump 109. The filter 108 can eliminate extraneous matters of photoresist supplied through the photoresist supply line 105. The photoresist pump 109 can suck and pressurize the photoresist stored in the photoresist storage tank 101 and spray the photoresist through the photoresist supply line 105.

A pressure sensor 111 and a fluid control valve 231 are connected to the photoresist supply line 105. The pressure sensor 111 can measure the pressure of the supplied photoresist. The fluid control valve 231 functions as the fluid controller (refer to 200 of FIG. 1) that controls the on/off and flow rate of the supplied photoresist. The fluid control valve 231 will be described in more detail later.

A suckback valve 233 is connected to the photoresist supply line 105 at a rear end of the fluid control valve 231. After the nozzle unit 300 sprays photoresist, the suckback valve 233 sucks a predetermined amount of photoresist existing at the tip of the nozzle unit 300 using an air line 235 and prevents the spill of the photoresist.

The photoresist passes through the fluid control valve 231 and the suckback valve 233 and is sprayed on the semiconductor wafer 405 through a nozzle 301 located at the tip of the nozzle assembly 305 of the nozzle unit 300. In other words, the nozzle 301 is located above the center of the semiconductor wafer 405 so that the photoresist is sprayed through the nozzle assembly 305. The nozzle assembly 305 includes the nozzle 301 located at the tip thereof and a nozzle arm 303 connected to the nozzle 301. The semiconductor wafer 405 is loaded into the photoresist coating unit 400 (refer to FIG. 1). The photoresist coating unit 400, which is used to coat photoresist, is connected to a bowl 401 and a motor 407 and rotatable. The photoresist coating unit 400 includes a chuck 403 located in the bowl 401 and the semiconductor wafer 405 located on the chuck 403.

The photoresist coating apparatus according to the present invention includes a camera 507 functioning as the nozzle monitoring unit 500 (refer to FIG. 1). The camera 507 is disposed outside the photoresist coating unit 400 to monitor the shape of the nozzle 301 or the spraying amount of the photoresist. The camera 507 includes a light source 501, a lens 503, and a camera controller 505. The light source 501 emits light, for example, ultraviolet light or visible light, to the nozzle 301 of the nozzle assembly 305. The lens 503 receives light reflected by the nozzle 301 of the nozzle assembly 305. The camera controller 505 monitors the nozzle 301 of the nozzle assembly 305 and outputs an electric signal, for example, an image signal or a voltage (or current) signal, to the controller 600. The camera 507 monitors whether or not the nozzle 301 deviates from its decided position, whether or not the nozzle 301 is contaminated, whether or not air bubbles are generated, the flow length or sucked height of the photoresist, a time taken to spray the photoresist, the spraying amount of the photoresist, or a time taken to delay the spraying of the photoresist. The function of the camera 507 will be described in more detail later.

The photoresist coating apparatus according to the present invention includes a computer 601, which is connected to the camera 507, converts data monitored by the camera 507 into an electric signal, and processes the electric signal. The computer 601 functions as the controller 600 (refer to FIG. 1). The electric signal processed by the computer 601 is fed back into the fluid control valve 231, so that the fluid control valve 231 can control the on/off and the flow rate of the photoresist sprayed from the nozzle 301 of the nozzle assembly 305.

Figure 3:
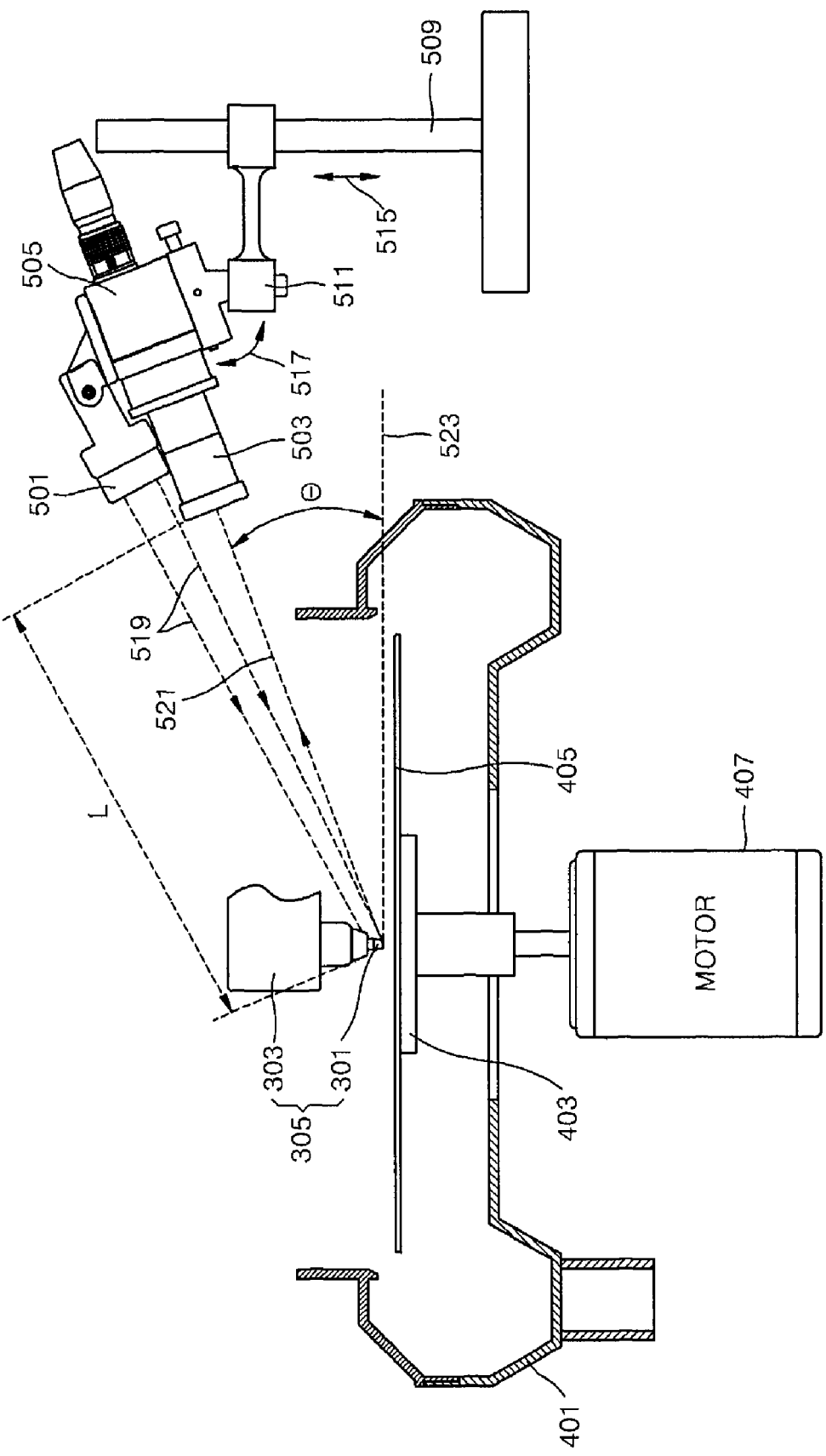
FIG. 3 illustrates the position and function of a camera shown in FIG. 2.

FIG. 3 illustrates the position and function of the camera 507 shown in FIG. 2.

Referring to FIG. 3, the camera 507 is installed outside the photoresist coating unit 400 as described above. The camera 507 is adjustable in a vertical direction 515 and a lateral direction 517 using stands 509, 511, and 513. The camera 507 includes the light source 501, the lens 503, and the camera controller 505. The light source 501 emits incident light 519 to the nozzle 301 of the nozzle assembly 305. The lens 503 receives reflection light 521 reflected by the nozzle 301 of the nozzle assembly 305. The camera controller 505 monitors the nozzle 301 of the nozzle assembly 305, using the received reflection light 503 and outputs an electric signal to the computer 601.

Particularly, after the present inventors conducted a lot of experiments, the following result was obtained. That is, the lens 503 of the camera 507 may be installed such that an angle θ made by a line 523 extending from the nozzle 301 of the nozzle assembly 305 in a plane direction of the semiconductor wafer 405 with a light path of the reflection light 521 ranges from 5 to 45°, preferably 7 to 30°, and is most preferably 21°. Also, the lens 503 of the camera 507 may be installed such that a linear distance L between the lens 503 of the camera 507 and the nozzle 301 of the nozzle assembly 305 ranges from 140 to 300 mm. In this case, the shape of the nozzle 301 located at the tip of the nozzle assembly 305 or the spraying amount of the photoresist can be easily monitored. Specifically, the camera 507 can monitor whether or not the nozzle 301 deviates from its decided position, whether or not the nozzle 301 is contaminated, whether or not air bubbles are generated, the flow length or sucked height of the photoresist, a time taken to spray the photoresist, the spraying amount of the photoresist, or a time taken to delay the spraying of the photoresist.

FIG. 4 is a magnified view of the fluid control valve shown in FIG. 2.

Referring to FIG. 4, the fluid control valve 231 (refer to FIG. 2) according to the present invention includes a body 201 and a cam 207 disposed in the body 201. The cam 207 includes a yoke cam 203 installed in the body 201 and a camshaft 205 connected to the yoke cam 203. The cam 207 is connected to a speed reducer 209 and a motor 211, for example, a direct-current (DC) motor. The speed reducer 209 functions to reduce the rotation speed of the motor 211. While the camshaft 205 is rotating, the yoke cam 203 moves up and down. In other words, as the camshaft 205 functioning as a driving body rotates, the yoke cam 203 functioning as a driven body moves up and down.

The motor 211 is connected to a breaker 213 and an encoder 215. The breaker 213 is used to prevent the generation of an overcurrent. The encoder 215 is used to convert the displacement of the motor 211, for example, the number of rotations, into digital signals to be transmitted to the computer 601. A diaphragm 217 is installed under the cam 207 located in the body 201.

In other words, the diaphragm 217 is installed under the yoke cam 203 so that while the yoke cam 203 is moving up and down, the diaphragm 217 also moves up and down. When the diaphragm 217 moves up, a fluid, for example, photoresist, is injected via a fluid injection port 219 installed on one side of the body 201, flows through a fluid flow line 220 in the arrow direction, and is exhausted via a fluid exhaust port 221 installed on the other side of the body 201. The fluid flow line 220 is located under the diaphragm 217.

In the fluid control valve 231, the diaphragm 217 moves up and down using the motor 211 to which the cam 207 is attached. As the diaphragm 217 moves up and down, the flow of the fluid (e.g., the photoresist) is precisely controlled. It takes only 10 ms for the fluid control valve 231 to operate after the fluid control valve 231 receives an electric signal through the motor 211 from the computer 601. The speed at which the diaphragm 217 moves up and down can be controlled reproducibly and precisely and freely changed.

Typically, a direction in which a motor rotates should be switched from a forward direction to a reverse direction so that a diaphragm can move up and down. Also, the rotation of the motor should be completely stopped to switch the rotation direction of the motor from the forward direction to the reverse direction, thereby naturally causing a delay time. However, since the fluid control valve 231 according to the present invention includes the cam 207 installed at a shaft of the motor 211, the motor 211 has only to rotate in one direction so that the speed at which the diaphragm 217 moves up and down can be precisely controlled.

FIGS. 5 and 6 illustrate operation of the fluid control valve 231 shown in FIG. 4. Specifically, FIG. 5 illustrates a closed-off state of the fluid control valve 231, while FIG. 6 illustrates an open state of the fluid control valve 231.

Referring to FIG. 6, when a motor, which is in gear with the cam 207, makes half a revolution clockwise, the diaphragm 217 moves up so that the fluid control valve 231 is completely opened. That is, in FIG. 6, when the diaphragm 217 moves up, a fluid (e.g., photoresist) is injected via the fluid injection port 219, flows through the fluid flow line 220 in the arrow direction, and is exhausted via the fluid exhaust line 221.

Inversely, referring to FIG. 5, when the motor, which is in gear with the cam 207 in the state shown in FIG. 6, makes half a revolution again, the fluid flow valve 231 is completely closed off. That is, in FIG. 5, since the diaphragm 217 moves down, even if the fluid is injected, the fluid cannot be exhausted via the fluid exhaust port 221.

Figure 7:
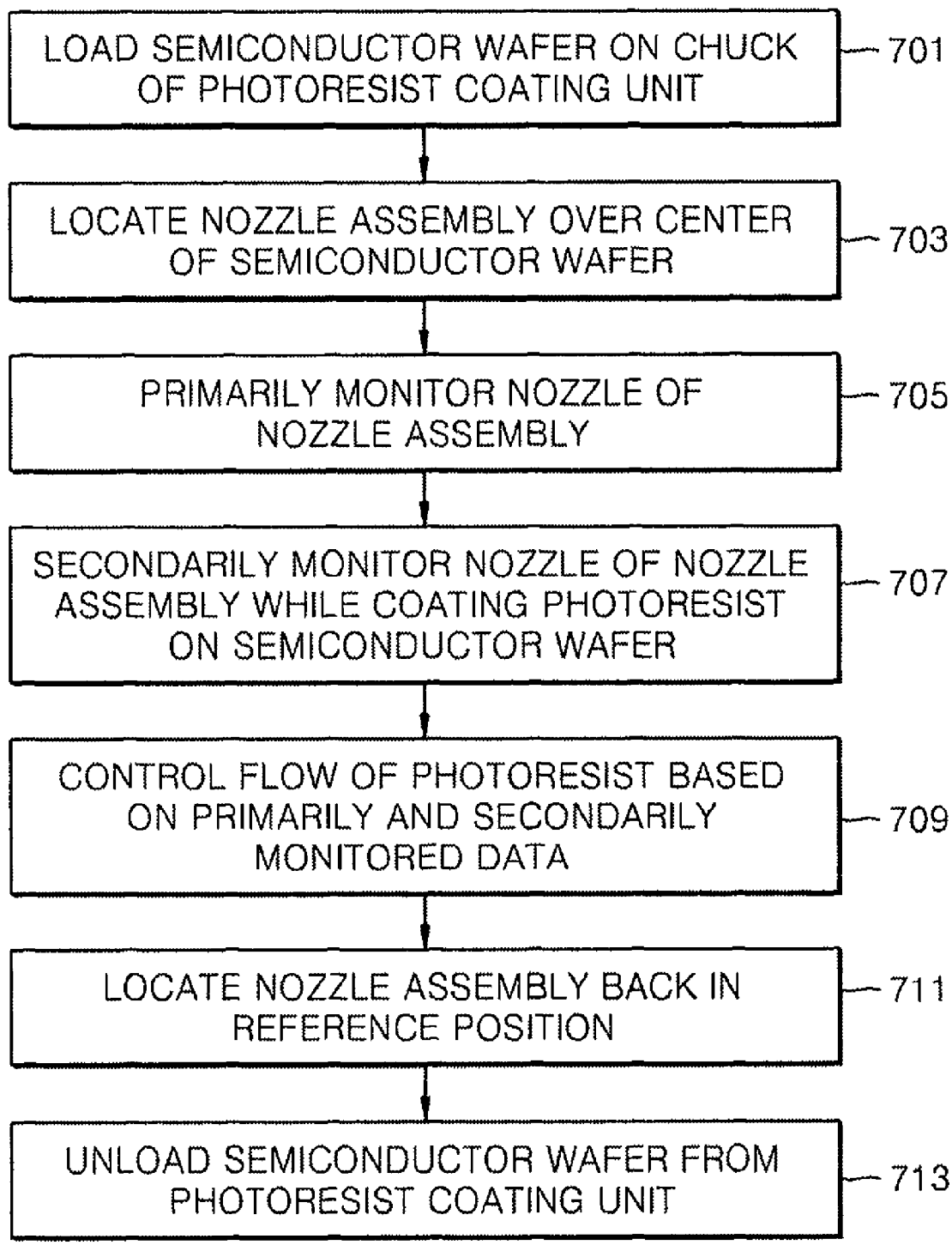
FIG. 7 is a flow chart illustrating a method of coating photoresist according to an embodiment of the present invention.
Figure 8:
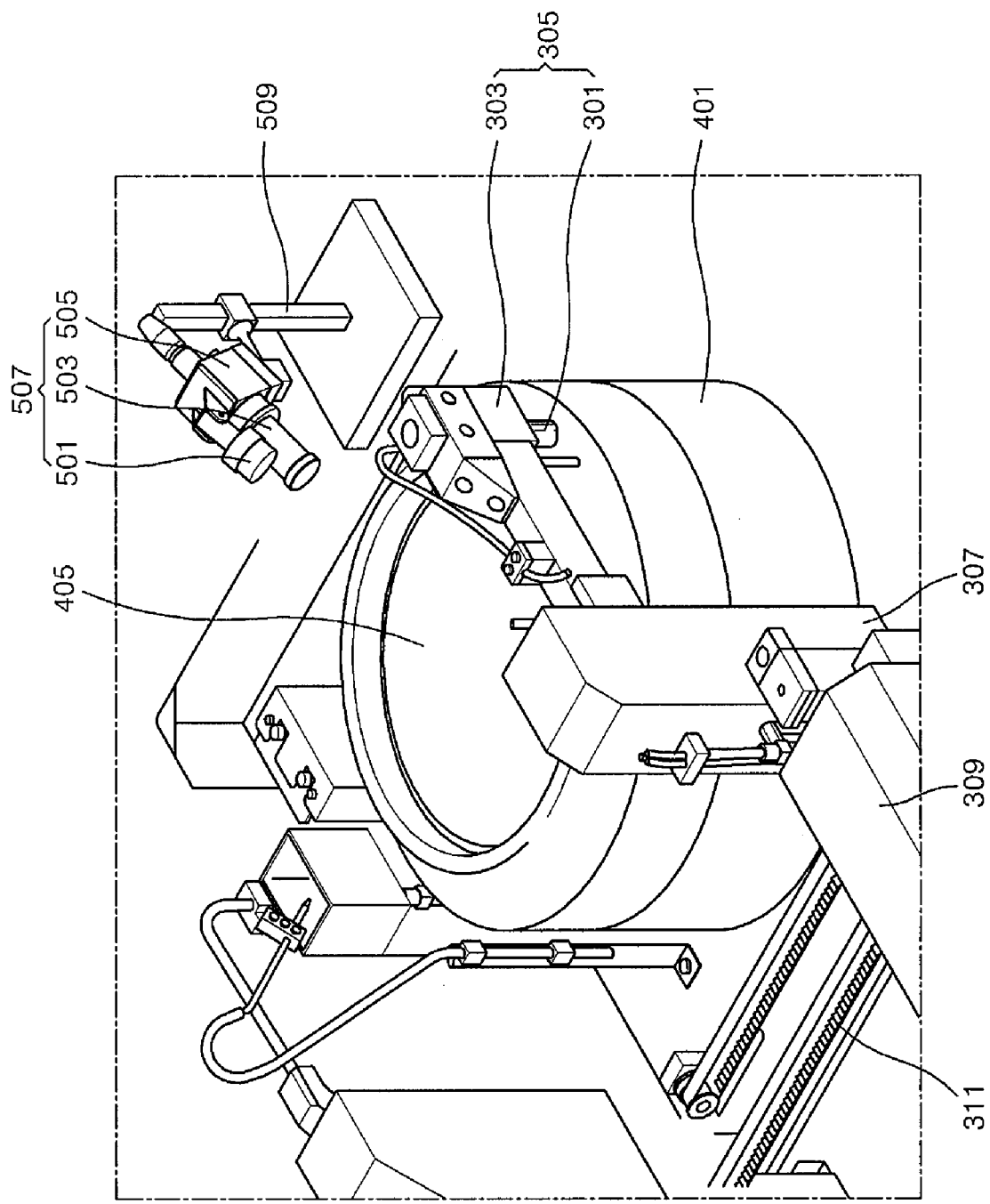
FIGS. 8 and 9 are perspective views of a photoresist coating apparatus, which illustrate the method shown in FIG. 7.
Figure 9:
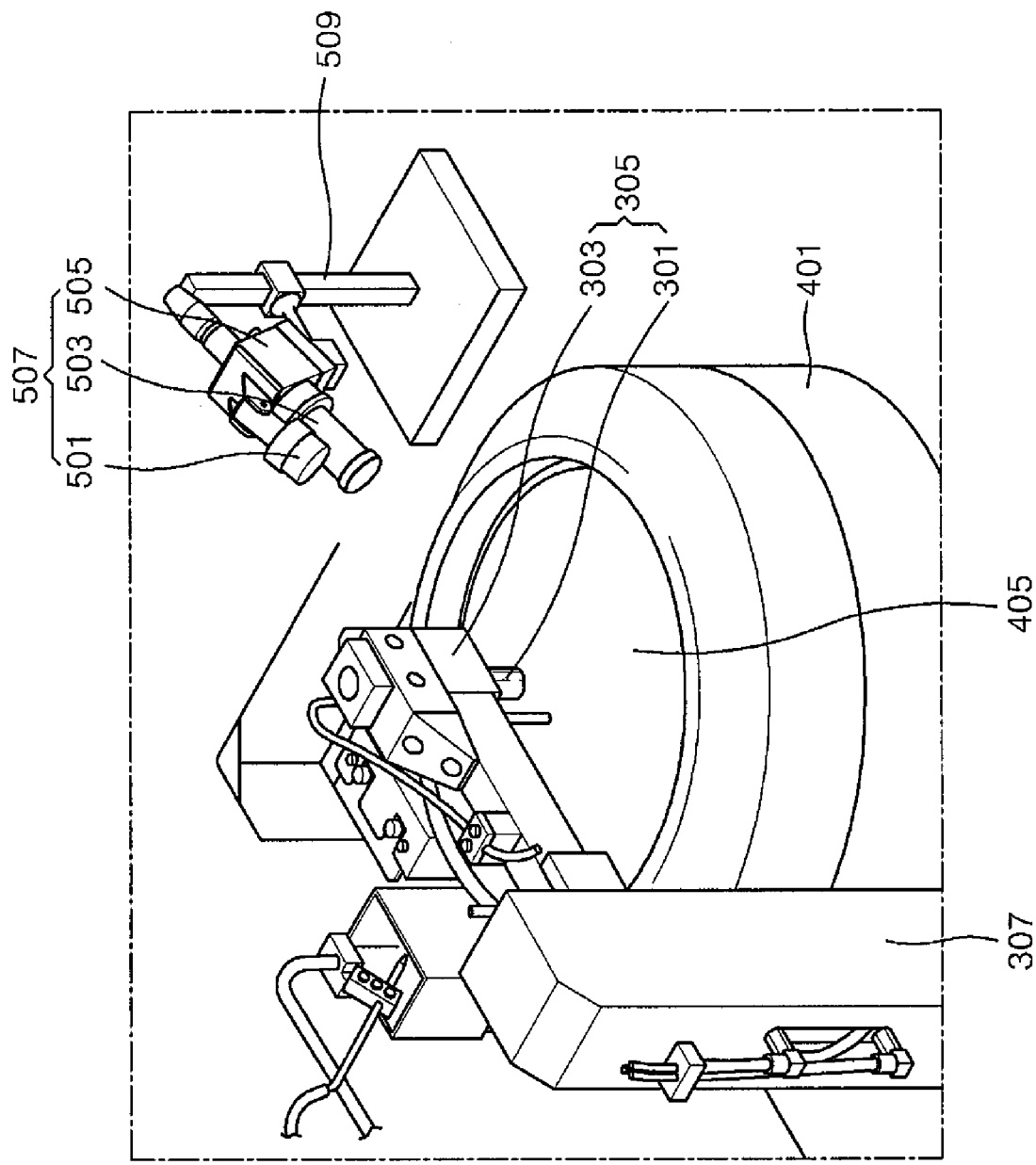

FIG. 7 is a flow chart illustrating a method of coating photoresist according to an embodiment of the present invention, and FIGS. 8 and 9 are perspective views of a photoresist coating apparatus, which illustrate the method shown in FIG. 7.

Referring to FIG. 7, a method of coating photoresist according to the present invention includes loading a semiconductor wafer 405 on a chuck of a photoresist coating unit 400 as illustrated in FIG. 8 (operation 701). As illustrated in FIG. 9, a nozzle assembly 305 is transferred such that a nozzle 301 is located over the center of the chuck of the photoresist coating unit 400 (operation 703).

The transfer of the nozzle assembly 305 includes moving the nozzle assembly 305 upward, locating nozzle assembly supports 307 and 309 over the center of the semiconductor wafer 405, and moving the nozzle assembly 305 down to keep a predetermined distance between the nozzle assembly 305 and the semiconductor wafer 405. The nozzle assembly 305 is installed to be capable of moving up and down in the nozzle assembly support 307.

Whether or not a nozzle 301 of the nozzle assembly 305 deviates from its decided position, whether or not the nozzle 301 is contaminated, whether or not air bubbles are generated, the flow length or sucked height of photoresist, a time taken to spray the photoresist, the spraying amount of the photoresist, or a time taken to delay the spraying of the photoresist are primarily monitored using a camera 507 constituting the nozzle monitoring unit 500 (refer to FIG. 1) (operation 705). The primary monitoring operation includes emitting incident light from a light source of the camera 507 to the nozzle 301 of the nozzle assembly 305, transmitting light reflected by the nozzle 301 of the nozzle assembly 305 toward a lens of the camera 507, and converting the reflected light into an electric signal and processing the electric signal using a camera controller. In other words, a lens is used for receiving reflection light reflected by the nozzle of the nozzle assembly 305 and a camera controller is used for monitoring the nozzle 301 of the nozzle assembly using the received reflection light to output an electric signal to the controller.

While coating photoresist on the semiconductor wafer 405 via the nozzle 301 of the nozzle assembly 305, the spraying amount of the photoresist is secondarily monitored using the camera 507 (operation 707). During the secondary monitoring operation, a time taken to spray the photoresist or a time taken to delay the spraying of the photoresist is monitored together. The time taken to delay the spraying of the photoresist is monitored by comparing the on/off time of the electric signal processed by the controller 600 (refer to FIG. 1) with the spraying/interruption times of the photoresist detected by the camera 507.

Data obtained from the primary and secondary monitoring operations using the camera 507 are converted into electric signals and processed by the controller 600. Thus, the processed electric signals are applied to the fluid flow valve 231 (refer to FIG. 2) to control the flow of the photoresist sprayed on the semiconductor wafer 405 in the photoresist coating unit 400 (operation 709). The nozzle assembly 305 is removed from the center of the semiconductor wafer 405 and located back in a reference position as illustrated in FIG. 8 (operation 711). Thereafter, the semiconductor wafer 405 is unloaded from the photoresist coating unit 400 so that the photoresist coating operation is finished (operation 713).

FIGS. 10 through 13 are magnified views of examples of a nozzle assembly that enables a primary monitoring operation using a photoresist coating apparatus according to an embodiment of the present invention.

Specifically, FIGS. 10 through 13 illustrate examples of a nozzle assembly 305 that enables a primary monitoring operation using a camera 507 of a photoresist coating apparatus according to an embodiment of the present invention. In FIGS. 10 through 13, reference numeral 315 refers to photoresist filled in the nozzle 301.

Figure 10:
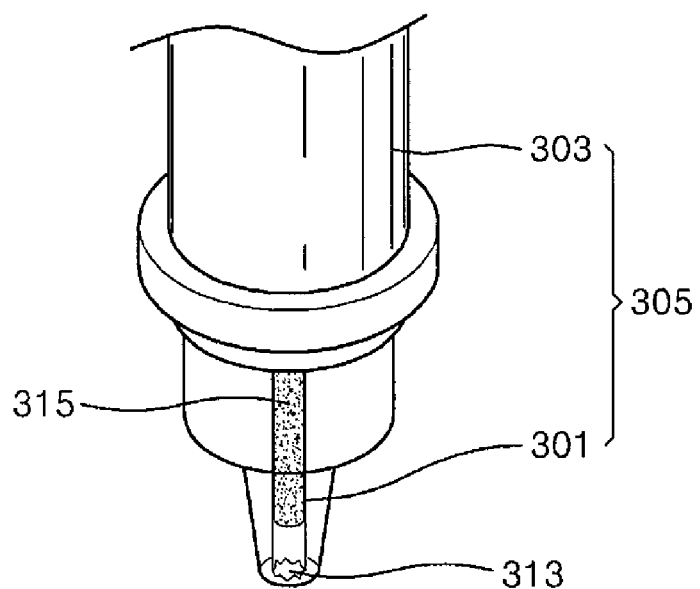
FIGS. 10 through 13 are magnified views of examples of a nozzle assembly that enables a primary monitoring operation using a photoresist coating apparatus according to an embodiment of the present invention.
Figure 11:
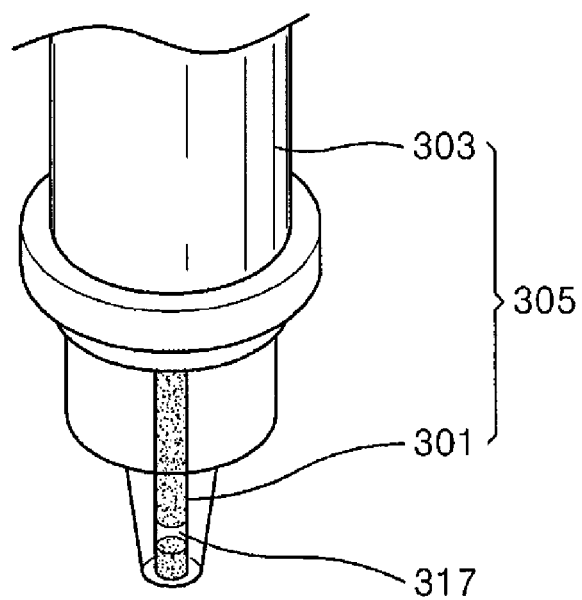

Referring to FIG. 10, air bubbles flow in the photoresist supply line 105 (refer to FIG. 2) so that the end of the nozzle 301 is broken (refer to 313) during the spraying of the photoresist 315. The breakage 313 of the nozzle 301 can be detected by comparing images of the nozzle 301 taken using the camera 507 before and after the breakage 313. FIG. 11 illustrates air bubbles 317 flowing in the nozzle 301. The air bubbles 317 are generated due to the property of the photoresist 315 and a pressure difference of a curve of the photoresist supply line 105 generated when the photoresist 315 flows through the photoresist supply line 105. Like the breakage 313 of the nozzle 301, the air bubbles 317 can be detected by comparing images taken using the camera 507 before and after the generation of the air bubbles 317.

Figure 12:
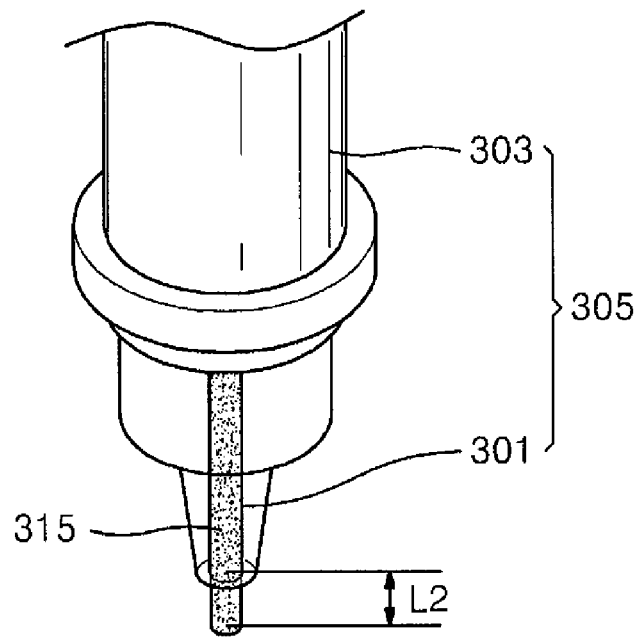

Referring to FIG. 12, when the spraying of the photoresist 315 via the nozzle 301 of the nozzle assembly 305 is stopped using the computer 601 (refer to FIG. 2) and the fluid control valve 231 (refer to FIG. 2), the spilled length L2 of the photoresist 315 is shown. The spilled length L2 of the photoresist 315 also can be detected using the camera 507.

Figure 13:
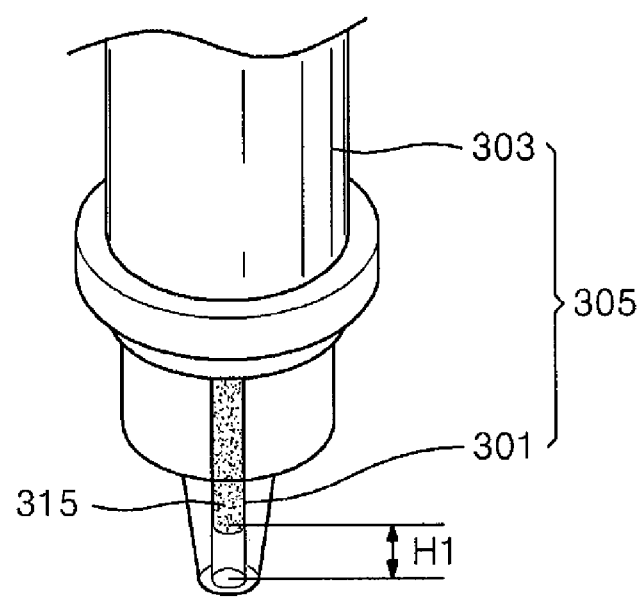

Referring to FIG. 13, after the spraying of the photoresist 315 via the nozzle 301 of the nozzle assembly 305 is stopped using the computer 601 and the fluid control valve 231, when the photoresist 315 is sucked by the suckback valve 233, the sucked height H1 of the photoresist 315 is shown. Similarly, the sucked height H1 of the photoresist 315 can be detected using the camera 507.

Figure 14:
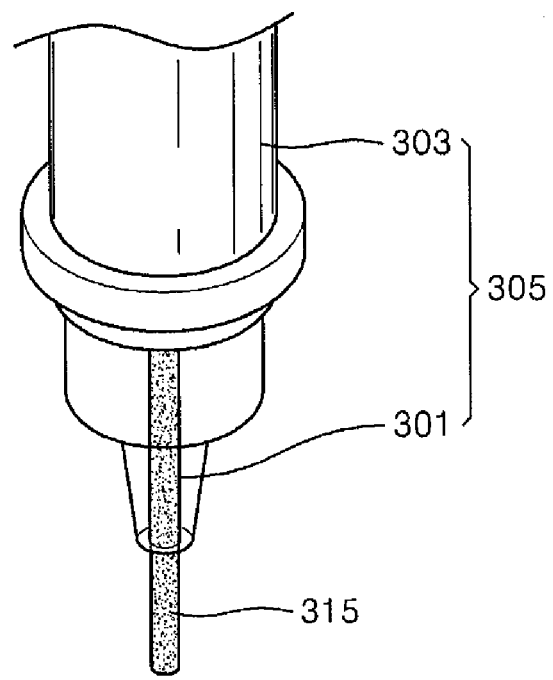
FIGS. 14 and 15 are magnified views of examples of a nozzle assembly that enables a secondary monitoring operation using a photoresist coating apparatus according to an embodiment of the present invention.
Figure 15:
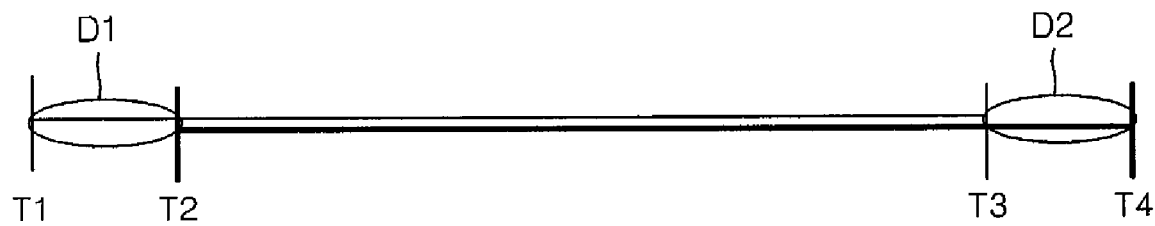

FIGS. 14 and 15 are magnified views of examples of a nozzle assembly that enables a secondary monitoring operation using a photoresist coating apparatus according to an embodiment of the present invention.

Specifically, FIGS. 14 and 15 illustrate examples of a nozzle assembly 305 that enables a secondary monitoring operation using a camera 507 (refer to FIG. 2) of a photoresist coating apparatus according to an embodiment of the present invention. Assuming that photoresist is not cut as indicated by reference numeral 315 of FIG. 14, the amount of the photoresist sprayed via the nozzle 301 is calculated by measuring a spray start time T2 and a spray stop time T4 using the camera controller 505 (refer to FIG. 2) of the camera 507. Of course, a time taken to spray the photoresist is also measured during the calculation of the spraying amount of the photoresist.

Furthermore, spray delay times D1 and D2 are monitored during the secondary monitoring operation by respectively comparing an on-time T1 and an off-time T3 of an electric signal processed by the computer 601 with the spray start time T2 and the spray stop time T4 of the photoresist, which are detected using the camera 507. When the spray delay times D1 and D2 are beyond the limits of predetermined specifications, an alarm is given to control the flow of photoresist sprayed on a semiconductor wafer.

The invention claimed is:

1. A photoresist coating apparatus comprising:
   a photoresist supply line through which photoresist is supplied;

a fluid control valve connected to the photoresist supply line to control the flow of the photoresist;

a nozzle assembly connected to the photoresist supply line at a rear end of the fluid control valve, the nozzle assembly including a nozzle located above the center of a semiconductor wafer loaded in a photoresist coating unit to spray the photoresist;

a camera located outside the photoresist coating unit to monitor the shape or spraying amount of the nozzle located at the tip of the nozzle assembly; said camera comprising a light source for emitting incident light to the nozzle of the nozzle assembly, a lens for receiving reflection light reflected by the nozzle of the nozzle assembly, and a camera controller for monitoring the nozzle of the nozzle assembly using the received reflection light to output an electric signal to the controller; and a controller for converting data monitored by the camera into an electric signal and processing the electric signal, wherein the electric signal processed by the controller is fed back into the fluid control valve to control the flow of the photoresist sprayed via the nozzle of the nozzle assembly.

2. The apparatus of claim 1, wherein the lens of the camera is installed such that an angle made by a line extending from the nozzle of the nozzle assembly in a plane direction of the semiconductor wafer with a light path of the reflection light ranges from 5 to 45° and a linear distance between the lens of the camera and the nozzle of the nozzle assembly ranges from 140 to 300 mm.

3. The apparatus of claim 1, wherein the camera monitors whether or not the nozzle deviates from a decided position, whether or not the nozzle is contaminated, whether or not air bubbles are generated, the flow length or sucked height of the photoresist, a time taken to spray the photoresist, or a time taken to delay the spraying of the photoresist.

4. A method of coating photoresist, the method comprising:

loading a semiconductor wafer on a chuck of a photoresist coating unit;

transferring a nozzle assembly such that a nozzle is located over the center of the chuck of the photoresist coating unit;

primarily monitoring the shape of the nozzle of the nozzle assembly using a camera;

secondarily monitoring the spraying amount of photoresist using the camera while coating the photoresist on the semiconductor wafer via the nozzle of the nozzle assembly; said secondary monitoring the spraying amount of photoresist comprising monitoring time taken to spray the photoresist or a time taken to delay the spraying of the photoresist; and converting data primarily and secondarily monitored by the camera into an electric signal, processing the electric signal, and applying the electric signal to a fluid control valve to control the flow of the photoresist sprayed on the semiconductor wafer loaded in the photoresist coating unit.

5. The method of claim 4, wherein the primary monitoring of the shape of the nozzle comprises monitoring whether or not the nozzle deviates from a decided position, whether or not the nozzle is contaminated, whether or not air bubbles are generated, or the flow length or sucked height of the photoresist.

* * * * *

UNITED STATES PATENT AND TRADEMARK OFFICE
CERTIFICATE OF CORRECTION

| | | |
|---|---|---|
| PATENT NO. | : 7,736,918 B2 | |
| APPLICATION NO. | : 12/294551 | |
| DATED | : June 15, 2010 | |
| INVENTOR(S) | : Seo et al. | |

It is certified that error appears in the above-identified patent and that said Letters Patent is hereby corrected as shown below:

In claim 4, column 10, line 17, please replace "comprising monitoring time taken" with --comprising monitoring a time taken--.

Signed and Sealed this
Twenty-fifth Day of January, 2011

David J. Kappos
*Director of the United States Patent and Trademark Office*